United States Patent [19]

Nishizawa et al.

[11] 4,297,720

[45] Oct. 27, 1981

[54] MULTI-PHOTODIODES

[75] Inventors: Hideaki Nishizawa; Shin-Ichi Iguchi, both of Nishinomiya, Japan

[73] Assignee: Sumitomo Electric Industries, Ltd., Osaka, Japan

[21] Appl. No.: 59,118

[22] Filed: Jul. 19, 1979

[30] Foreign Application Priority Data

Jul. 21, 1978 [JP]  Japan .................................. 53-89690

[51] Int. Cl.³ ..................... H01L 27/14; H01L 29/161
[52] U.S. Cl. .......................................... 357/30; 357/16
[58] Field of Search ................... 357/30, 16; 250/211

[56] References Cited

U.S. PATENT DOCUMENTS 4,179,702  12/1979  Lamorte ................................ 357/30
4,213,138   7/1980  Campbell .............................. 357/30

*Primary Examiner*—Martin H. Edlow
*Attorney, Agent, or Firm*—Carothers and Carothers

[57] ABSTRACT

The present invention provides monolithic-structure type photodiodes in which the first photodiode is sensitive to an optical signal having one wavelength and the second photodiode is sensitive to another optical signal having a different wavelength, and in which the first and second photodiodes are superimposed together with an optical filter layer interposed between them which separates a multiplex optical signal into the first and second wavelength signals. Owing to their monolithic structure, the photodiodes of the present invention are extremely useful for receiving multiplex optical signals having a plurality of different wavelengths.

5 Claims, 3 Drawing Figures

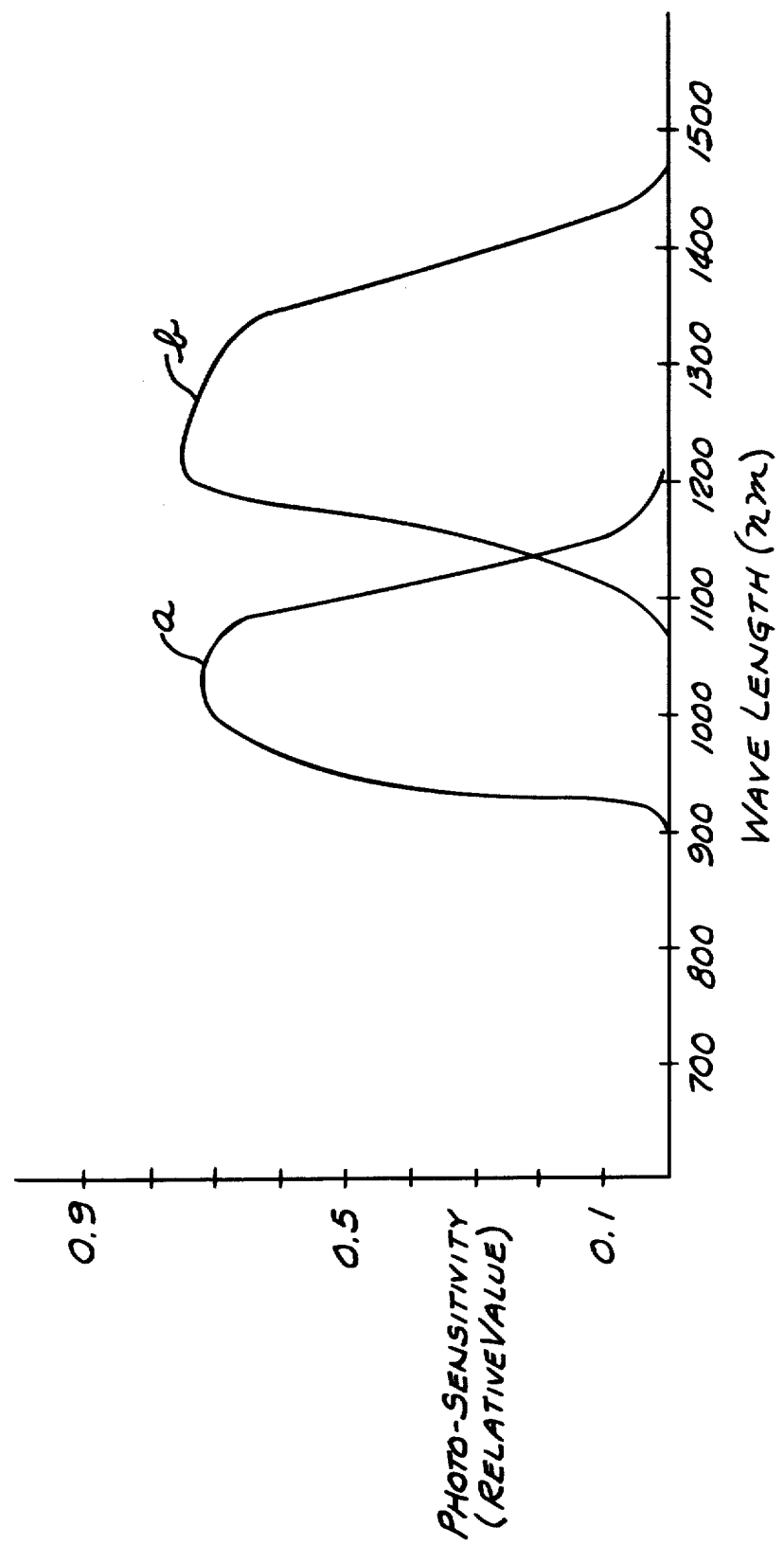

MULTI-PHOTODIODES

BACKGROUND OF THE INVENTION

1. Field of the Invention

The present invention relates to photodiodes which consist of semiconductor compounds.

2. Discussion of Prior Art

It is generally known in the first of optical fiber transmission systems, that multiplex optical signals, that is, signals carried by a plurality of different wavelengths transmitted via an optical fiber, are separated at the terminal of a receiving device into the individual component signals by means of a plurality of optical fibers and that the separated signals are then fed via separate optical fibers to individual photodiodes. Such systems have substantial drawbacks such as the necessity of using a troublesome technique for installing connectors that can obtain low loss contacts between optical fibers and filters and between optical fibers and photodiodes, and further receiving devices are expensive and inconveniently large.

SUMMARY OF THE INVENTION

The object of this invention is to provide multi-photodiodes which succeed in providing an improved optical communication system that overcomes the drawbacks mentioned above.

The photodiode of the present invention has a unitarily composed multi-diode structure, a so called monolithic structure, having two or more regions sensitive to different optical wavelengths and being piled up one over another by interposing filter layers between adjacent photo-sensitive regions.

Semiconductor materials, which inherently have a wavelength versus transmittance property determined by their forbidden band-gap energy, can be advantageously used as a filter layer for the purpose of providing the multiphotodiode of the present invention. For example, a semiconductor having a forbidden band-gap of 0.99 eV has an optical absorption band-edge at 1.25 μm, a semiconductor having a forbidden band-gap of 1.14 eV has an optical absorption band-edge at 1.09 μm. Further, a semiconductor having a forbidden band-gap of 0.89 eV has an optical absorption band-edge at 1.39 μm.

In respect to the semiconductor having a forbidden band-gap of 0.99 eV, its transmittance for light having a wavelength less than 1.2 μm is almost zero, while the transmittance is almost 100% for light having a wavelength more than 1.3 μm. When optical signals having wavelengths of 1.1 μm and 1.3 μm are simultaneously projected into such a semiconductor, they are separated. That is to say, the semiconductor can act as a good filter for separating the multiplex optical signals.

For the foregoing reason, when a first photodiode sensitive to 1.1 μm light but not sensitive to 1.3 μm light and a second photodiode sensitive to 1.3 μm are placed one over another by interposing a filter made of such semiconductor layer as mentioned above, the resulting monolithic-type photodiode of the present invention can receive and separate, with a very low cross-talk level, a multiplex optical signal of 1.1 μm and 1.3 μm wavelengths.

BRIEF DESCRIPTION OF THE DRAWINGS

Other objects and advantages appear in the following description and claims.

The accompanying drawings show, for the purpose of exemplification without limiting the invention or the claims thereto, certain practial embodiments illustrating the principles of this invention wherein:

FIG. 2 is a graph illustrating photo-sensitivity versus optical wavelength.

DESCRIPTION OF THE PREFERRED EMBODIMENTS

Figure 1:
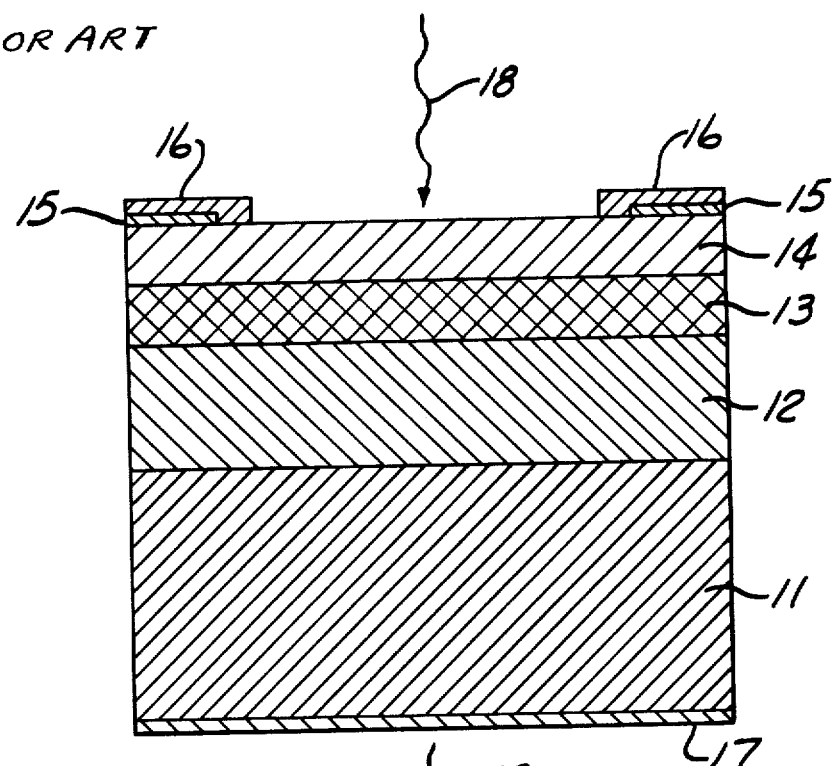
FIG. 1 is a cross-section of the structure of a conventional photodiode with hetero-structure.

A cross section of a conventional hetero junction type photodiode is shown in FIG. 1. It is to be noted that lead wires and the surrounding devices connected to them are not shown in any of the drawings of this specification.

Referring to FIG. 1, an n-type substrate 11 of InP (Sn doped, $n=1\times10^{18}$ cm$^{-3}$), a 5 μm-thick n-type InP layer 12 (Sn doped, $n=1\times10^{18}$ cm$^{-3}$), an intentionally undoped 3 μm-thick quaternary crystal layer 13 of $In_{1-x}Ga_xAs_yP_{1-y}$ (x=0.17, y=0.34) having a forbidden band-gap of 1.14 eV, and a 1 μm-thick p-type InP layer 14 (Cd doped, $p=5\times10^{17}$ cm$^{-3}$) are successively grown one over another by means of the liquid-phase epitaxial growth method. Further, a peripheral insulating layer 15 of SiO$_2$ is provided around the p-type InP layer 14 in order to leave a window for receiving light input. A p-type electrode 16 of Au-Zn extending over said insulating layer and contacting the p-type InP layer 14 and an n-type electrode 17 of Au-Sn are provided by the ordinary photolithography technique. The graph of photo-sensitivity versus optical wavelength of such a photodiode for input light 18 is given in curve a of FIG. 2.

In FIG. 2, curve b shows the photo-sensitivity versus optical wavelength of another photodiode produced by substituting a quaternary crystal layer of $In_{1-x}Ga_xAs_yP_{1-y}$ (x=0.32, y=0.73) having a forbidden band-gap of 0.89 eV for the quaternary crystal layer 13 of FIG. 1 and by substituting a p-type quaternary crystal layer of $In_{1-x}Ga_xAs_yP_{1-y}$ (x=0.24, y=0.55) having a forbidden band-gap of 0.99 eV for the p-type layer 14 in FIG. 1.

Figure 3:
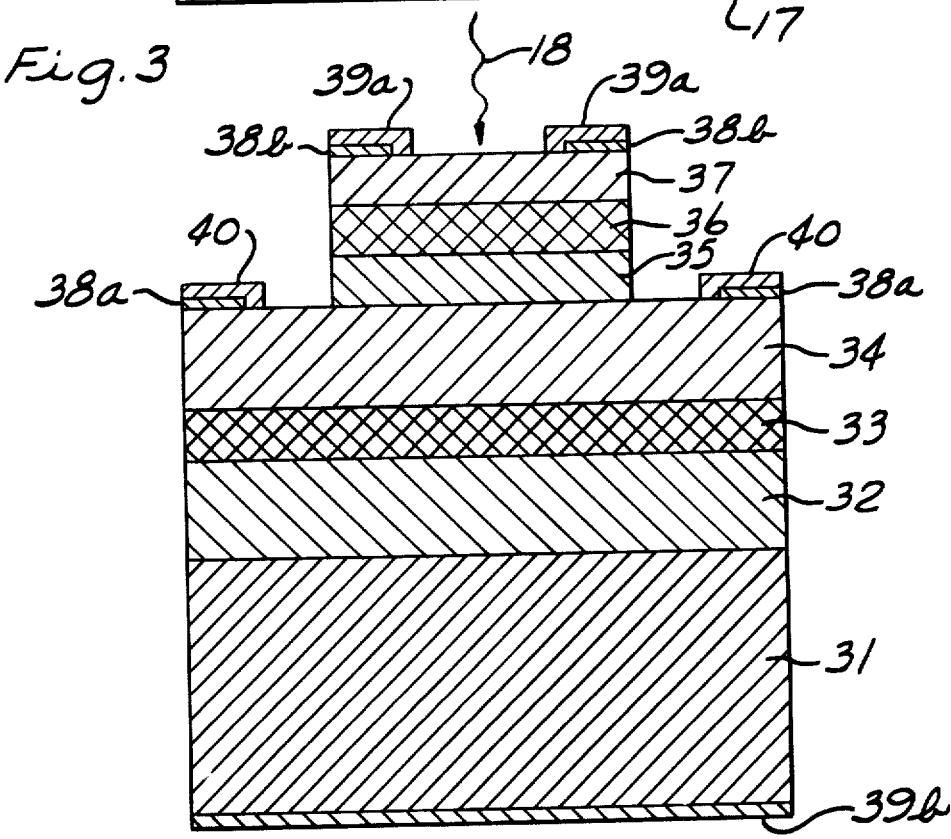
FIG. 3 is a cross-section of an example of the present invention, in this case, a multi-photodiode having $In_{1-x}Ga_xAs_yP_{1-y}$ quaternary crystal layers.

FIG. 3 is a cross section of an example of the embodiment of the present invention. Referring to FIG. 3, on a substrate 31 of n-type InP (Sn doped, $n=1\times10^{18}$ cm$^{-3}$), a 5 μm-thick n-type InP layer 32 (Sn doped, $n=1\times10^{18}$ cm$^{-3}$), a 3 μm-thick quaternary layer 33 of $In_{1-x}Ga_xAs_yP_{1-y}$ (x=0.32, y=0.73, intentionally undoped) having a forbidden band-gap of 0.89 eV, a 3 μm-thick quaternary layer 34 of $In_{1-x}Ga_xAs_yP_{1-y}$ (x=0.24, y=0.55, Cd doped, $p=5\times10^{17}$ cm$^{-3}$) having a forbidden band-gap of 0.99 eV, a 1 μm-thick p-type InP layer 35 (Cd doped, $p=5\times10^{17}$ cm$^{-3}$), a 3 μm-thick quaternary layer 36 of $In_{1-x}Ga_xAs_yP_{1-y}$ (x=0.17, y=0.37, intentionally undoped) having a forbidden band-gap of 1.14 eV, and a 1 μm-thick n-type InP layer 37 (Sn doped, $n=1\times10^{18}$ cm$^{-3}$) are successively grown one over another by means of the liquid-phase epitaxial growth method using the super cooling technique.

Such multi-photodiodes produced as mentioned above have a monolithic hetero-structure in which the first receiving photodiode has a double-hetero-structure composed of an n-type InP layer 32 having a forbidden band-gap of 1.34 eV, an InGaAsP quaternary crystal layer 33 having a forbidden band-gap of 0.89 eV ($E_1$), and a p-type InGaAsP quaternary crystal layer 34 having a forbidden band-gap of 0.99 eV ($E_3$); in which the second receiving photodiode has a double-hetero-structure composed of a p-type InP layer 35 having a forbidden band-gap of 1.34 eV, an InGaAsP quaternary crystal layer 36 having a forbidden band-gap of 1.14 eV ($E_2$), and an n-type InP layer 37 having a forbidden band-gap of 1.34 eV; and in which an intermediate InGaAsP quaternary crystal layer 34, functioning as an optical filter, is interposed between the first and the second photodiodes.

Such a multi-photodiode also satisfies the condition of $E_1 < E_3 < E_2$.

For making such a monolithic photodiode as shown in FIG. 3, after the six layers are grown on the substrate, the peripheral portions of layers 35, 36 and 37 are removed by an etching solution of $Br_2:CH_3OH = 1:100$, in order to expose the top surface of layer 34 to provide room for an electrode common to both photodiodes.

Further, insulation layer 38a over the peripheral surface zone of layer 34, insulation layer 38b over the peripheral surface zone of layer 37, an n-type Au-Sn ohmic electrode 39a extending over insulation layer 38b and contacting the surface of layer 37, a p-type Au-Zn ohmic electrode 40 extending over insulation layer 38a and contacting a portion of the surface of layer 34, and an n-type Au-Sn ohmic electrode 39b covering the bottom of substrate 31, are all fabricated as shown in FIG. 3 by means of the ordinary photolithography technique.

When light 18 carrying multiplex optical signals on wavelengths of 1.06 μm and 1.27 μm is projected through the window of layer 37, separate signals are detected, with a very low cross-talk level, by the first photodiode and the second photodiode, respectively, by virtue of the interposed filter layer 34.

The second example of the embodiment of the present invention, which has the same structure as shown in FIG. 3, and which is composed of a basic semiconductor material of $Al_xGa_{1-x}As$ ($0 \leq x \leq 1$), will be explained next.

On a substrate 31 of n-type GaAs (Si-doped, $n = 1 \times 10^{18}$ cm$^{-3}$), a 5 μm-thick first layer 32 of $Al_xGa_{1-x}As$ ($x = 0.3$, Sn-doped, $n = 1 \times 10^{18}$ cm$^{-3}$) having a forbidden band-gap of 1.8 eV, a 2 μm-thick second layer 33 of $Al_xGa_{1-x}As$ ($x = 0$, intentionally undoped) having a forbidden band-gap of 1.43 eV, a 5 μm-thick third layer 34 of $Al_xGa_{1-x}As$ ($x = 0.1$, Ge-doped, $p = 5 \times 10^{17}$ cm$^{-3}$) having a forbidden band-gap of 1.53 eV, a 1 μm-thick fourth layer 35 of $Al_xGa_{1-x}As$ ($x = 0.3$, Ge-doped, $p = 5 \times 10^{17}$ cm$^{-3}$) having a forbidden band-gap of 1.8 eV, a 2 μm-thick fifth layer 36 of $Al_xGa_{1-x}As$ ($x = 0.2$, intentionally undoped) having a forbidden band-gap of 1.69 eV, and a 1 μm-thick sixth layer of $Al_xGa_{1-x}As$ ($x = 0.3$, Te-doped, $n = 1 \times 10^{18}$ cm$^{-3}$) having a forbidden band-gap of 1.8 eV are successively grown one over another by means of the liquid phase epitaxial growth method using the super cooling technique.

A multi-photodiode manufactured as mentioned above has a monolithic structure having two hetero-structure photodiodes and has a third layer 34 having a forbidden band-gap of 1.53 eV ($E_3$) interposed therebetween to act as an optical filter. In such a multi-photodiode, the first double-hetero-structure photodiode consists of a first layer 32 having a forbidden band-gap of 1.8 eV, a second layer 33 having a forbidden band-gap of 1.43 eV ($E_1$), and a third layer 34 having a forbidden band-gap of 1.53 eV; the second double-hetero-structure photodiode consists of a fourth layer 35 having a forbidden band-gap of 1.8 eV, a fifth layer 36 having a forbidden band-gap of 1.69 eV ($E_2$) and a sixth layer 37 having a forbidden band-gap of 1.8 eV; and the condition of $E_1 < E_3 < E_2$ is satisfied.

In such a multi-photodiode, all three electrodes are fabricated by means of the ordinary photolithography technique in the same manner as mentioned in the first example of embodiment.

When light 18 carrying multiplex optical signals on wavelengths of 0.7 μm and 0.85 μm is projected through the window of the sixth layer 37, separate signals are detected, with a very low cross-talk level, by the first photodiode and the second photodiode, respectively, by virtue of the interposed filter layer 34.

In such a multi-photodiode as shown in FIG. 3, it is also possible to make a photodiode suitable for detecting light signals of various wavelengths by changing the compositions and thicknesses of individual epitaxial layers.

Furthermore, it is quite evident that it is possible to make such a multi-photodiode suitable for detecting light carrying multiplex signals on more than two wavelengths, utilizing the present invention.

Although explanation has herein been given only about the integration of two or more double-hetero-structure photodiodes, the same structure can be used for the integration of two or more single-hetero-structure photodiodes and to any combination of double-hetero-structure, single-hetero-structure, or homo-structure photodiodes, excluding any such combination involving two or more homo-structure photodiodes, whether adjacent or not.

The technique for crystal growth is not limited to the liquid-phase epitaxial growth method as explained in the embodiment. It is also possible to use the vapor-phase epitaxial growth method and the molecular-beam epitaxial growth method.

As can be seen from the above-mentioned examples of the embodiment, the present invention provides novel photodiodes, that is, multi-photodiodes combining into a unitary structure two or more photodiodes and filter layers interposed therebetween, making it possible to produce a photodiode very suitable for use in multiplex optical communication systems.

We claim:

1. Multi-photodiodes comprising a first photodiode, having a photo-sensitive region with a forbidden band-gap $E_1$, and a second photodiode, having a photo-sensitive region with a forbidden band-gap $E_2$, each photodiode consisting of p-n structures or p-i-n structures of semiconductor compounds, said first and second photodiodes integrated into one body with an intermediate connecting semiconductor compound layer of at least one of said photodiodes providing a filter layer having a forbidden band-gap $E_3$, said forbidden band-gaps $E_1$, $E_2$, and $E_3$ being under the condition of $E_1 < E_3 < E_2$.

2. Multi-photodiodes as claimed in claim 1 in which the first and second photodiodes have hetero-structure.

3. Multi-photodiodes as claimed in claim 1 or 2 in which the semiconductor compounds are $In_{1-x}Ga_xAs_yP_{1-y}$ ($0 \leq x \leq 1$, $0 \leq y \leq 1$).

4. Multi-photodiodes as claimed in claim 1 or 2 in which the semiconductor compounds are $Al_xGa_{1-x}As$ ($0 \leq x \leq 1$).

5. Multi-photodiodes as claimed in claim 1 or 2 in which each layer composing said photodiodes is grown by the liquid-phase epitaxial growth technique.

* * * * *